United States Patent [19]
Wedell

[11] Patent Number: 5,130,576
[45] Date of Patent: Jul. 14, 1992

[54] SYNCHRONOUS ECL TO CMOS TRANSLATOR

[75] Inventor: Dennis L. Wendell, Pleasanton, Calif.

[73] Assignee: National Semiconductor Corporation, Santa Clara, Calif.

[21] Appl. No.: 641,984

[22] Filed: Jan. 16, 1991

[51] Int. Cl.[5] .......................................... H03K 19/017
[52] U.S. Cl. ..................................... 307/475; 307/448
[58] Field of Search ........................ 307/475, 455, 448

[56] References Cited

U.S. PATENT DOCUMENTS

| | | | |
|---|---|---|---|
| 4,789,798 | 12/1988 | Lach | 307/475 |
| 4,835,419 | 5/1989 | Chappel et al. | 307/475 |
| 4,933,648 | 6/1990 | Frogge | 307/475 |
| 4,968,905 | 11/1990 | Sanwo et al. | 307/475 |

Primary Examiner—David Hudspeth
Assistant Examiner—Andrew Sanders
Attorney, Agent, or Firm—Irving S. Rappaport; Robert C. Colwell; Jeanne C. Suchodolski

[57] ABSTRACT

An ECL to CMOS translator for BiCMOS circuits. The circuit has a first bipolar transistor which switches the translator from a quiescent state to an active state in the presence of an ECL high level signal. An amplifier driving an NMOS capacitive load amplifies this signal to CMOS levels. Two clock signals reset the circuit to the quiescent state once the ECL high signal has passed. The circuit is kept in the quiescent state by a current source.

8 Claims, 2 Drawing Sheets

SYNCHRONOUS ECL TO CMOS TRANSLATOR

BACKGROUND OF THE INVENTION

The present invention is related to translator circuits useful for converting emitter coupled logic (ECL) level signals to complementary metal oxide semiconductor (CMOS) level signals.

BiCMOS integrated circuits are semiconductor devices in which bipolar technology is combined with CMOS technology. BiCMOS integrated circuits are useful for providing, on a single chip, both the desirable switching speeds of bipolar devices and the desirable area requirements of CMOS devices. The resulting BiCMOS device has a silicon area per unit current drive which is much less than a comparable CMOS circuit. One goal, then, is to translate the on chip ECL level signals for use by the CMOS logic circuits located on the chip.

Some BiCMOS integrated circuit communicate with the outside world with signal levels appropriate for bipolar logic circuits while CMOS level signals are used within the device. A common bipolar logic used in BiCMOS devices is ECL which has a signal range from $-0.9$ to $-1.7$ volts. CMOS signals, however, swing in a 5-volt range. Another goal, then, is to bring ECL signals into the BiCMOS integrated circuit and translate these incoming signals into CMOS levels for use by the CMOS portion of the chip as quickly as possible.

SUMMARY OF THE INVENTION

The present invention provides a decoder translator for conversion of ECL level signals to CMOS level signals in synchronous architectures and also for translating clock signals to active input region latches. The present invention is four to five times faster than presently known BiCMOS translators and thereby improves the speed and efficiency of overall system operations over those systems using conventional BiCMOS translators.

According to one embodiment of the invention, the gate of a first PMOS transistor is connected to an input node for receiving ECL level signals. When the ECL signal is at a high level, the translator circuit is in a quiescent state and the output of the circuit is a CMOS high level signal. When the ECL level signal goes to a low level, the PMOS transistor turns on and activates the translator circuit. Activation of the translator circuit causes one of the circuit nodes to rise in potential from its quiescent state level of ground, activate pull down transistors which drive a capacitive load at the output terminal to CMOS levels.

The circuit is reset to the quiescent state by the input of two clock signals which activate two NMOS transistors and pull the circuit node back to the quiescent state of ground. The circuit node is kept at ground during the quiescent state by a current keeper circuit.

The translator of the present invention has a propagation delay of only 250–300 picoseconds using leff=0.9 μm technology and is significantly faster than other known translator circuits. In particular, the translator of the present invention is inherently faster than the standard asynchronous translator because the present translator is synchronous semidynamic and not ratioed. In addition, the output node is extremely lightly loaded. There is no DC current source fighting the output.

DESCRIPTION OF THE PREFERRED EMBODIMENT

Figure 1:
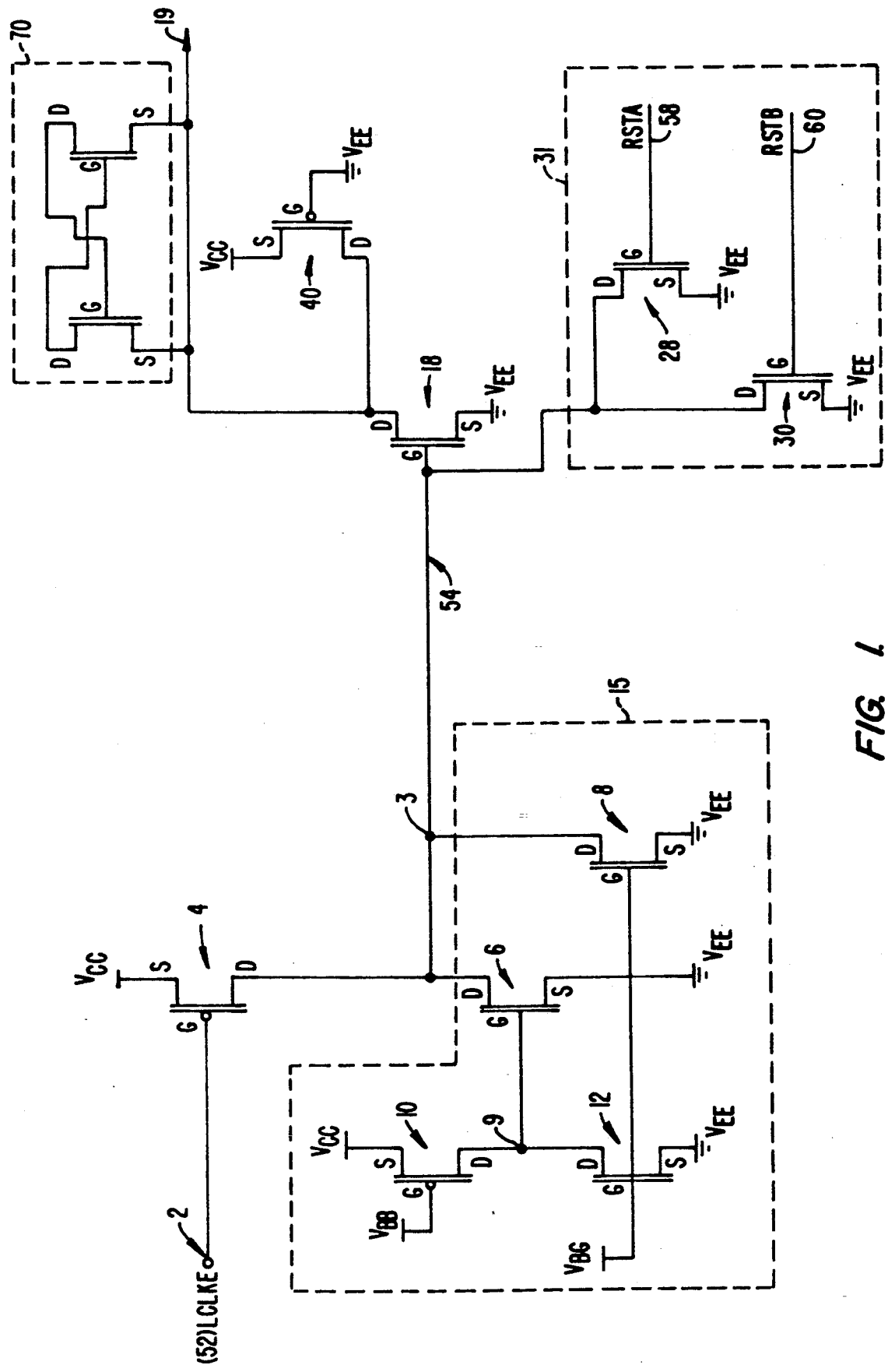
FIG. 1 is a circuit diagram of an embodiment of the present invention.

FIG. 1 is a circuit diagram of an embodiment of the present invention. The circuit has an input terminal 2 which receives ECL signals from an input pad (not shown). Input terminal 2 is coupled to a node 3 via the gate of a PMOS transistor 4. The source of PMOS transistor 4 is tied to $V_{cc}$, or 0 volts and the drain of PMOS transistor 4 is tied to node 3. PMOS transistor 4 is turned on by a one-volt signal and serves to transition the translator from the quiescent to the active state when an ECL low level signal is applied to input terminal 2.

Also coupled to node 3, are NMOS transistors 6 and 8, and through these transistors, PMOS transistor 10 and NMOS transistor 12. The drains of both transistors 6 and 8 are coupled to node 3, and the source of both transistors are coupled to $V_{ee}$. Transistor 6 serves as a current source to keep node 3 at $V_{ee}$ during the quiescent state of the device. Transistor 8 is also a current source and functions as a compensator for holding node 3 in fast process/mode skew conditions.

The gate of transistor 6 is coupled to a node 9 at which the drain of transistors 10 and 12 also connect. Transistor 10 has its source tied to $V_{cc}$ and its gate tied to $V_{bb}$. The gate of transistor 12 is tied to $V_{bg}$, and also to the gate of transistor 8. The source of transistor 12 is tied to $V_{ee}$. Transistors 10 and 12 keep node 9 at a reference voltage of $+1.25$ volts relative to $V_{ee}$ which allows transistor 6 to saturate when node 3 rises to $V_{cc}$ in response to an ECL low signal. Together, devices 6–12 serve to overcome process skew by modifying the voltage on the gate of transistor 6. This group of transistors 15 thus provides built in compensation for differences in circuit parameters introduced by the fabrication process and compensates shifts due to a transistor 4 partial on condition.

Also coupled to node 3 is the gate of NMOS transistor 18. This transistor turns on as the voltage of node 3 rises to $V_{cc}$ in response to the ECL low signal. The source of this transistor is tied to $V_{ee}$ and the drain is coupled to output node 19. Therefore, when transistor 18 turns on, as a result of the ECL low signal, node 19 is pulled to a low state. In this manner, the regenerative load, represented by a box 70 is driven. One possible purpose of this circuit is therefore as a latch activator. However, the circuit may be used to drive any small capacitive load.

NMOS transistors 28 and 30 function as a reset circuit 31 to return the circuit to its quiescent state by returning node 3 to its quiescent condition in response to clock signals RSTA applied to the gate of transistor 28 and RSTB applied to the gate of transistor 30. The source of each transistor is tied to $V_{ee}$, and the drain of each transistor is coupled to node 3.

A keeper device, PMOS transistor 40 turns on when node 3 falls to its quiescent state and pulls node 19 back up to $V_{cc}$ from the low state. This keeper device has its gate tied to $V_{ee}$ and its source tied to $V_{cc}$. The drain is tied to node 19. Alternatively, node 19 may be reset by a PMOS transistor in response to a reset signal (RSTC).

Figure 2:
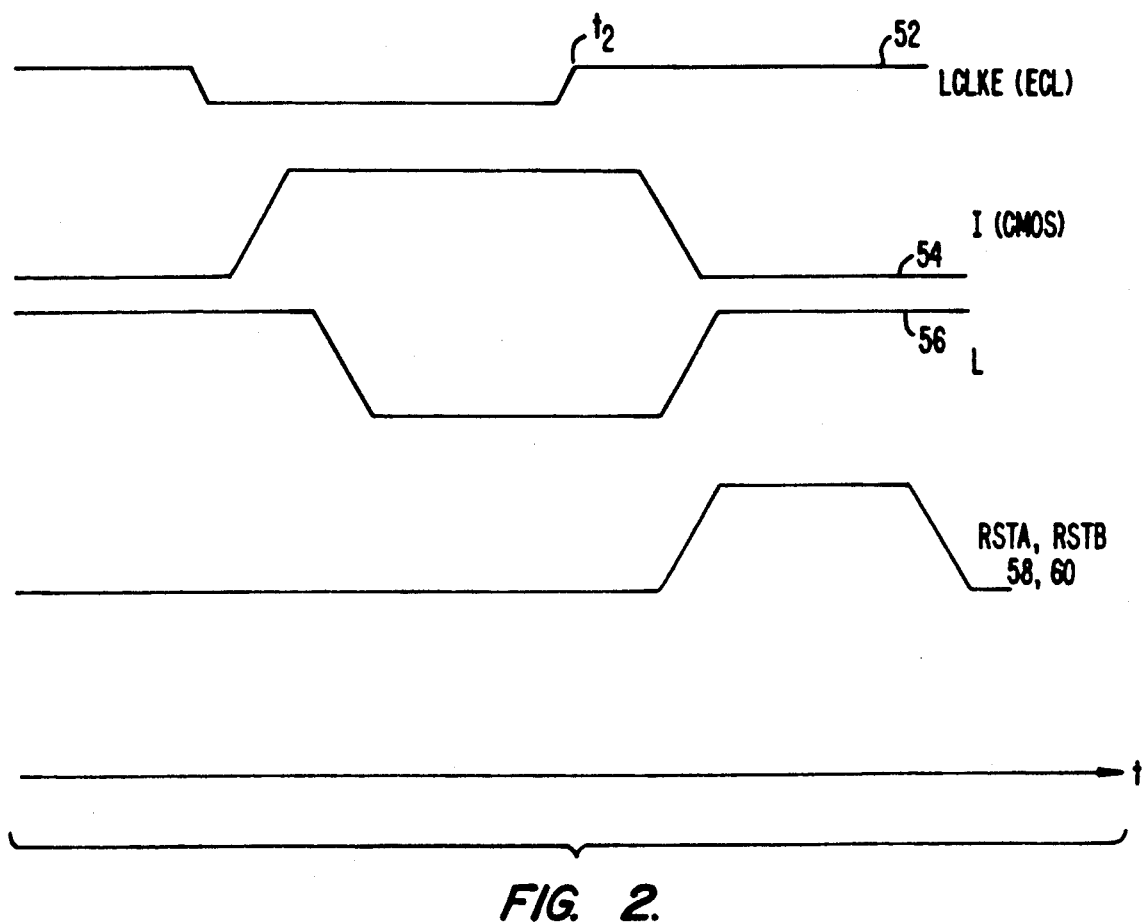
FIG. 2 is a timing diagram illustrative of the operation of the circuit given in FIG. 1.

FIG. 2 contains a timing diagram which illustrates operation of the circuit of FIG. 1. The translator circuit of FIG. 1 is activated by a drop in the voltage of input signal LCLKE 52 from an ECL high level of −900 millivolts to −1.6 volts. The drop in signal voltage causes transistor 4 to turn on, and the voltage 54 of node 3 begins to rise. Once node 3 rises to $V_{cc}$, a CMOS compatible level of $>V_{TH}$ (Threshold voltage of NMOS), transistor 18 turns on and pulls the voltage 56 of node 19 to the low state. A CMOS level low signal of zero volts is now available as output on node 19.

At time t2, the low signal on LCLKE goes to a high state and LCLKE returns to a high state ECL signal of −900 millivolts. This activity turns off transistor 4. Transistor 40 then operates to return the signal level at node 19 back to $V_{cc}$. Clock signals 58 and 60, RSTA and RSTB, then appear at the gates of transistors 28 and 30 respectively. These transistors return node 3 to its initial, or quiescent state, value of $V_{ee}$. Transistor 18 is turned off by reset signals RSTA/RSTB.

The translator of the present invention will remain in the quiescent state so long as no ECL low signal is present at input terminal 2. While in the quiescent state, the voltage at node 3 is maintained at $V_{ee}$ by current sources 6 and 8. Transistors 6 and 8 thereby also serve to maintain node 3 below the threshold voltage of transistor 18, preventing premature activation of that transistor. Since transistor 4 is partially on $V_{gs} \approx 900$ mV in the ECL high state.

The preferred embodiment of the present invention has now been described. Variations will be readily apparent to those skilled in the art. For example, the recovery circuit 31 may consist of a single transistor rather than the two transistors shown in the preferred embodiment. A single transistor recovery circuit would remove any overlap capacitance between the two transistors and improve circuit speed. Alternately, a derivative of the node 19 circuit could reset all nodes in the circuit. Furthermore, LCLKE could be used to reset the circuit at some time delay later. Those skilled in the art will also recognize that the invention may be implemented by transistors having a polarity opposite of that shown in the drawings, if voltages of opposite polarity are applied. For these reasons, the scope of the invention should be interpreted in light of the claims.

What is claimed is:

1. A BiCMOS translator circuit having an input terminal for receiving an input signal, and an output terminal for outputting an output signal comprising:
    a first MOS transistor having a gate electrode connected to said input terminal, a source electrode connected to a first reference voltage and a drain electrode connected to a first node, wherein said first MOS transistor raises said first node above a fixed potential when said input signal is in the first of two possible states;
    a first MOS circuit connected to said first node for maintaining said first node at said fixed potential when said input signal is in the second of said two possible states;
    a second MOS transistor, having a gate connected to said first node, a source connected to a second reference voltage and a drain electrode coupled to said output terminal, which raises said output terminal to said second reference voltage when said first node is raised above said fixed potential;
    a third MOS transistor, having a gate connected to said second reference voltage, a source connected to said first reference voltage, and a drain coupled to said output terminal, which raises a potential of said output terminal from a potential equal to said second reference voltage to a level equal to said first reference voltage, when said first node falls below said fixed potential; and
    a second MOS circuit, having an input and an output, wherein said output is connected to said first node and said input is connected to a control signal which triggers a reset of said first node to said fixed potential.

2. The translator circuit of claim 1 further comprising:
    a third MOS circuit, connected to said output terminal, which provides a capacitive load.

3. The translator circuit of claim 2 wherein said third MOS circuit comprises two cross coupled MOS transistors.

4. The translator circuit of claim 1 wherein said first MOS circuit comprises:
    a fourth MOS transistor, having a drain electrode connected to said first node, a gate electrode connected to a second node, and a source electrode to said second reference voltage;
    a fifth MOS transistor, having a drain electrode connected to said first node, a source electrode connected to said second reference voltage, and a gate electrode connected to a gate electrode of a sixth MOS transistor;
    said sixth MOS transistor having said gate electrode connected to a third reference voltage, a source electrode connected to the second reference voltage and a drain electrode connected to said second node;
    a seventh MOS transistor, having a source electrode connected to the first reference voltage, a gate electrode connected to a fourth reference voltage and a drain electrode connected to said second node.

5. The translator circuit of claim 1 wherein said second MOS circuit comprises:
    an eighth MOS transistor having a gate electrode coupled to a first control signal, a source electrode connected to the second reference voltage, a drain electrode connected to said first node; and
    a ninth MOS transistor having a gate electrode coupled to a second control signal, a source electrode connected to the second reference voltage and a drain electrode connected to said first node.

6. The invention of claim 1 wherein:
    said first MOS transistor is a PMOS transistor;
    said second MOS transistor is an NMOS transistor; and
    said third MOS transistor is a PMOS transistor.

7. The invention of claim 4 wherein said fourth, fifth and sixth transistors are NMOS transistors; and
    said seventh transistor is a PMOS transistor.

8. The invention of claim 5 wherein said eighth and ninth MOS transistors are NMOS transistors.

* * * * *

UNITED STATES PATENT AND TRADEMARK OFFICE
CERTIFICATE OF CORRECTION

PATENT NO. : 5,130,576
DATED : July 14, 1992
INVENTOR(S) : Dennis L. Wendell It is certified that error appears in the above-identified patent and that said Letters Patent is hereby corrected as shown below:

On the title page,
Item [19] Please correct inventor name from "Wedell" to Wendell.

Signed and Sealed this

Twelfth Day of October, 1993

Attest:

BRUCE LEHMAN

Attesting Officer    Commissioner of Patents and Trademarks